(12) United States Patent
Chapman et al.

(10) Patent No.: US 7,662,263 B2
(45) Date of Patent: *Feb. 16, 2010

(54) FIGURE CORRECTION OF MULTILAYER COATED OPTICS

(75) Inventors: Henry N. Chapman, Livermore, CA (US); John S. Taylor, Livermore, CA (US)

(73) Assignee: EUV LLC., Santa Clara, CA (US)

( * ) Notice: Subject to any disclaimer, the term of this patent is extended or adjusted under 35 U.S.C. 154(b) by 438 days.

This patent is subject to a terminal disclaimer.

(21) Appl. No.: 10/256,317

(22) Filed: Sep. 27, 2002

(65) Prior Publication Data

US 2004/0061868 A1  Apr. 1, 2004

(51) Int. Cl.
*C23C 14/34* (2006.01)
*G03F 1/00* (2006.01)

(52) U.S. Cl. .......................... 204/192.34; 204/192.26; 216/65; 216/66; 216/94; 216/24; 430/5

(58) Field of Classification Search ............ 204/192.34, 204/192.26; 216/65, 66, 94, 24
See application file for complete search history.

(56) References Cited

U.S. PATENT DOCUMENTS

| | | | | |
|---|---|---|---|---|
| 3,699,334 | A | * | 10/1972 | Cohen et al. ............ 250/492.2 |
| 5,272,744 | A | * | 12/1993 | Itou et al. ..................... 378/35 |
| 5,318,869 | A | * | 6/1994 | Hashimoto et al. ............. 430/5 |
| 5,420,436 | A | | 5/1995 | Seya et al. |
| 5,948,468 | A | | 9/1999 | Sweatt et al. |
| 5,958,143 | A | | 9/1999 | Weber et al. |
| 5,973,826 | A | | 10/1999 | Chapman et al. |
| 5,986,795 | A | | 11/1999 | Chapman et al. |
| 6,134,049 | A | | 10/2000 | Spiller et al. |
| 6,186,632 | B1 | | 2/2001 | Chapman et al. |
| 6,206,528 | B1 | | 3/2001 | Ray-Chaudhuri et al. |
| 6,226,346 | B1 | | 5/2001 | Hudyma |
| 6,262,836 | B1 | | 7/2001 | Hudyma et al. |
| 6,398,374 | B1 | | 6/2002 | Chapman et al. |

(Continued)

FOREIGN PATENT DOCUMENTS

JP   11-354404   * 12/1999

(Continued)

OTHER PUBLICATIONS

Mackowski et al., "VIRGO Mirrors: Wavefront Control", Opt and Quant. Elec. 31, 507-514 (1999) (for the case of visible-light optics).

(Continued)

*Primary Examiner*—Rodney G McDonald
(74) *Attorney, Agent, or Firm*—Rutan & Tucker LLP

(57) ABSTRACT

A process is provided for producing near-perfect optical surfaces, for EUV and soft-x-ray optics. The method involves polishing or otherwise figuring the multilayer coating that has been deposited on an optical substrate, in order to correct for errors in the figure of the substrate and coating. A method such as ion-beam milling is used to remove material from the multilayer coating by an amount that varies in a specified way across the substrate. The phase of the EUV light that is reflected from the multilayer will be affected by the amount of multilayer material removed, but this effect will be reduced by a factor of 1−n as compared with height variations of the substrate, where n is the average refractive index of the multilayer.

21 Claims, 2 Drawing Sheets

Plot of peak reflectivity, at normal incidence, of a MoSi multilayer as a function of the number of layers in the multilayer, for a wavelength of 13.4 nm. The multilayer period is 6.9 nm

U.S. PATENT DOCUMENTS

| | | | |
|---|---|---|---|
| 6,627,362 B2 * | 9/2003 | Stivers et al. | 430/5 |
| 6,641,959 B2 * | 11/2003 | Yan | 430/5 |
| 6,664,554 B2 | 12/2003 | Klebanoff et al. | |
| 6,821,682 B1 * | 11/2004 | Stearns et al. | 430/5 |
| 6,844,272 B2 * | 1/2005 | Taylor et al. | 438/787 |
| 6,875,543 B2 | 4/2005 | Chapman et al. | |
| 6,909,774 B2 * | 6/2005 | Oshino et al. | 378/84 |
| 6,967,168 B2 * | 11/2005 | Stearns et al. | 438/706 |
| 7,027,226 B2 | 4/2006 | Goldberg et al. | |
| 7,050,237 B2 | 5/2006 | Chapman | |
| 2003/0164494 A1 * | 9/2003 | Lee | 257/20 |

OTHER PUBLICATIONS

A study by Spence et al. "Film-stress-induced deformation of EUV reflective optics," Proc. SPIE 3679,724-734(1999) shows that the non-spherical deformation due to film stress variation of 10% is small, on the order of 0.1 nm RMS.

* cited by examiner

Plot of peak reflectivity, at normal incidence, of a MoSi multilayer as a function of the number of layers in the multilayer, for a wavelength of 13.4 nm. The multilayer period is 6.9 nm

FIGURE CORRECTION OF MULTILAYER COATED OPTICS

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The present invention relates to minimizing errors in the components of the optical system of an extreme ultraviolet lithography (EUVL) system, and more specifically, it relates to a method and apparatus for performing figure corrections in multilayer-coated optics.

2. Description of Related Art

EUV lithographic optical systems require aspheric surfaces to be fabricated better than the most accurate mirror optics ever made. This requires improvements both in the polishing of optics and in the measurement of optics. This invention addresses both issues, by improving the precision to which EUV optics can be figured, primarily by making corrections to multilayer coated optics by etching or polishing the coating. The method also relieves the precision required in the measurement of the optics, since the etching has a much larger effect on visible wavelengths, used for measuring, than on the EUV wavelengths, used in use. Solutions that have been proposed by others for correcting mirrors have included depositing a film of material (such as Silicon) onto the multilayer and then polishing that film, without disturbing the multilayer. The figured film acts as a phase corrector, but it also causes absorption.

A thin-film phase corrector has been described by Mackowski et al. "VIRGO Mirrors: Wavefront Control," Opt and Quant. Elec. 31, 507-514 (1999) (for the case of visible-light optics) and Yamamoto and Hatano, "EUV Reflection Phase Correction At A Multilayer Surface," XEL-99 conference (for the case of EUV optics). In both these cases a thin film, acting as a refractive phase corrector, is deposited on the surface. In the latter case, this film is deposited on to the top of the multilayer coating.

See also U.S. Pat. No. 5,948,468, by Sweatt and Weed, titled "Method Of Correcting Imperfections On A Surface," (Sep. 7, 1999), and U.S. patent application serial No. 10/086, 922 by Taylor et al, titled "Correction Of Localized Shape Errors On Optical Surfaces By Altering The Localized Density Of Surface Or Near-Surface Layers," incorporated herein by reference. In these methods, the substrate height errors are corrected directly, with the use of a thin film deposited on the substrate. In the case of Sweatt and Weed, the film is deposited through a specially designed mask so that its thickness varies across the substrate in such a way as to fill in the height errors of the substrate. In the case of Taylor et al. the correcting film is a uniform multilayer film. This film is chosen not for its reflective properties, but for its mechanical property of changing density upon heating. By applying heat locally and in a controlled way, the thickness of the film can be precisely modified to cancel out the substrate errors. In both of these methods the corrector film deposition and processing would be carried out prior to multilayer coating. In these cases, the thickness of film required is equal to the height error of the substrate, and there is no refractive factor.

SUMMARY OF THE INVENTION

It is an object of the present invention to correct the figure errors of multilayer-coated optics, especially for use in EUVL.

Another object of the invention is to correct figure errors by removing material from the multilayer coating itself without significantly degrading the reflective properties of the multilayer.

These and other objects will be apparent based on the disclosure herein.

The present invention is a process for producing near-perfect optical surfaces, for EUV and soft-x-ray optics. The method involves polishing or otherwise figuring the multilayer coating that has been deposited on an optical substrate, in order to correct for errors in the figure of the substrate and coating. A method such as ion-beam milling could be used to remove material from the multilayer coating by an amount that varies in a specified way across the substrate. The phase of the EUV light that is reflected from the multilayer will be affected by the amount of multilayer material removed, but this effect will be reduced by a factor of $1-n$ as compared with height variations of the substrate, where n is the average refractive index of the multilayer. As an example, for a MoSi multilayer reflecting 13.4 nm radiation, with $n=0.97$, there is a factor of 33 increase in sensitivity in correcting for substrate errors by polishing the multilayer coating. This means that the smallest substrate height errors that can be corrected are 33 times smaller than the limits set by removal height resolution and metrology height resolution. This vastly improves the precision to which EUV optical systems can be fabricated.

The invention is useful in the fabrication of mirrors for EUV lithography, astronomy, ICF diagnostics, EUV imaging, soft-x-ray microscopy for materials characterization and biomedical diagnostics, EUV and soft-x-ray interferometry.

DETAILED DESCRIPTION OF THE INVENTION

A process is disclosed for producing near-perfect optical surfaces, for EUV and soft-x-ray optics. The method involves polishing or otherwise figuring the multilayer coating that has been deposited on an optical substrate, in order to correct for errors in the figure of the substrate and coating. A method such as ion-beam milling can be used to remove material from the multilayer coating by an amount that varies in a specified way across the substrate. The phase of the EUV light that is reflected from the multilayer will be affected by the amount of multilayer material removed, but this effect will be reduced by a factor of $1-n$ as compared with height variations of the substrate, where n is the average refractive index of the multilayer. As an example, for a MoSi multilayer reflecting 13.4 nm radiation ($n=0.97$), a 0.1 nm deep depression in the substrate can be corrected by removing $0.1/(1-n)\text{nm}=3.3$ nm of material from the multilayer. As can be seen, there is a factor of 33 increase in sensitivity in correcting for substrate errors by polishing the multilayer coating. This means that the smallest substrate height errors that can be corrected are 33 times smaller than the limits set by removal height resolution and metrology height resolution. This vastly improves the precision to which EUV optical systems can be fabricated.

Many optical systems operating in EUV and soft-x-ray wavelengths consist of all-reflective designs. In such systems the light reflects from the mirror elements of these system at angles near normal incidence and multilayer coatings are required to achieve non-negligible reflectivity. An example of such a system is a ring-field projection optics camera for EUV lithography, such as described by Hudyma and Shafer in U. S. Pat. No. 6,262,836, titled "High Numerical Aperture Ring Field Projection System For Extreme Ultraviolet Lithography", incorporated herein by reference. This system consists of six mirrors, all of which have aspheric shapes. For its use in microlithography, the system wavefront error of this camera must be less than 0.5 nm RMS, which means that the aspheric surfaces must be each fabricated to less than 0.1 nm RMS error. The substrates are coated with multilayered films, designed to reflect EUV light. For EUV lithography the multilayer coatings typically consist of alternating layers of Molybdenum and Silicon, with thicknesses of 3 and 4 nm, respectively. A coating may consist of 60 layer pairs, for a total thickness of 420 nm. Multilayer coatings may be deposited on substrates by a variety of methods including magnetron sputtering and ion-beam deposition.

Figure 1:
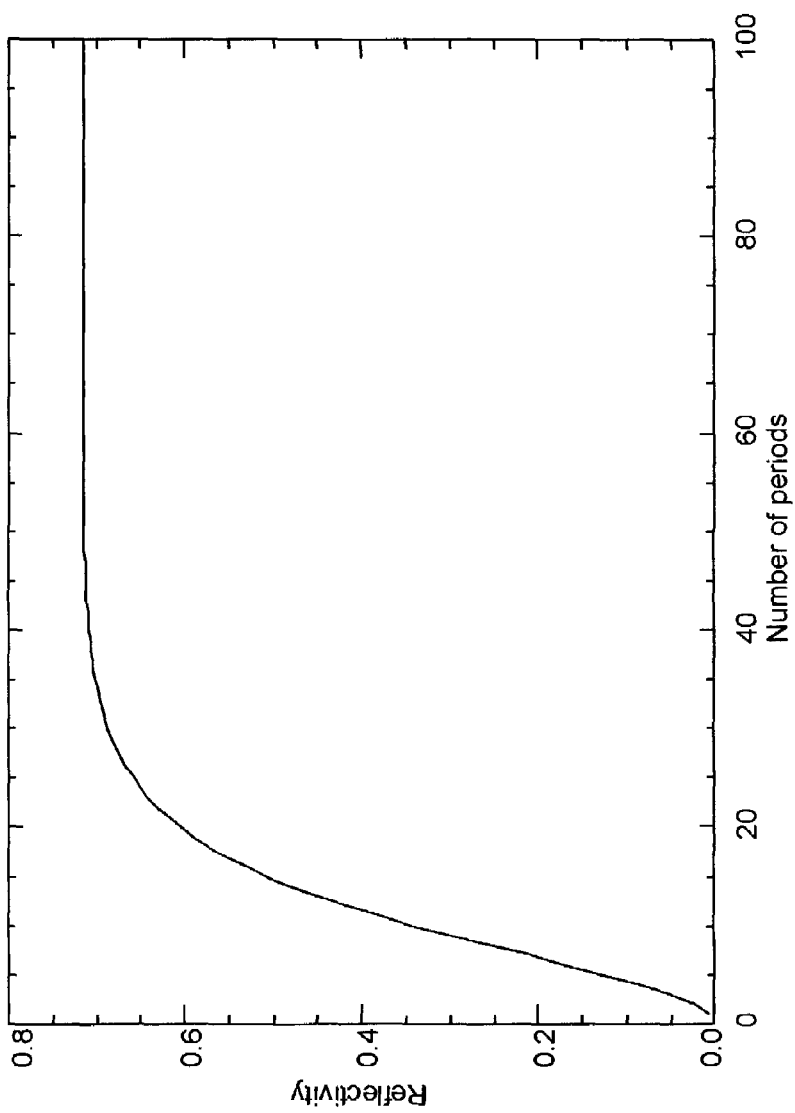
FIG. 1 shows a plot of reflectivity of a MoSi multilayer as a function of the number of layers.
Figure 2:
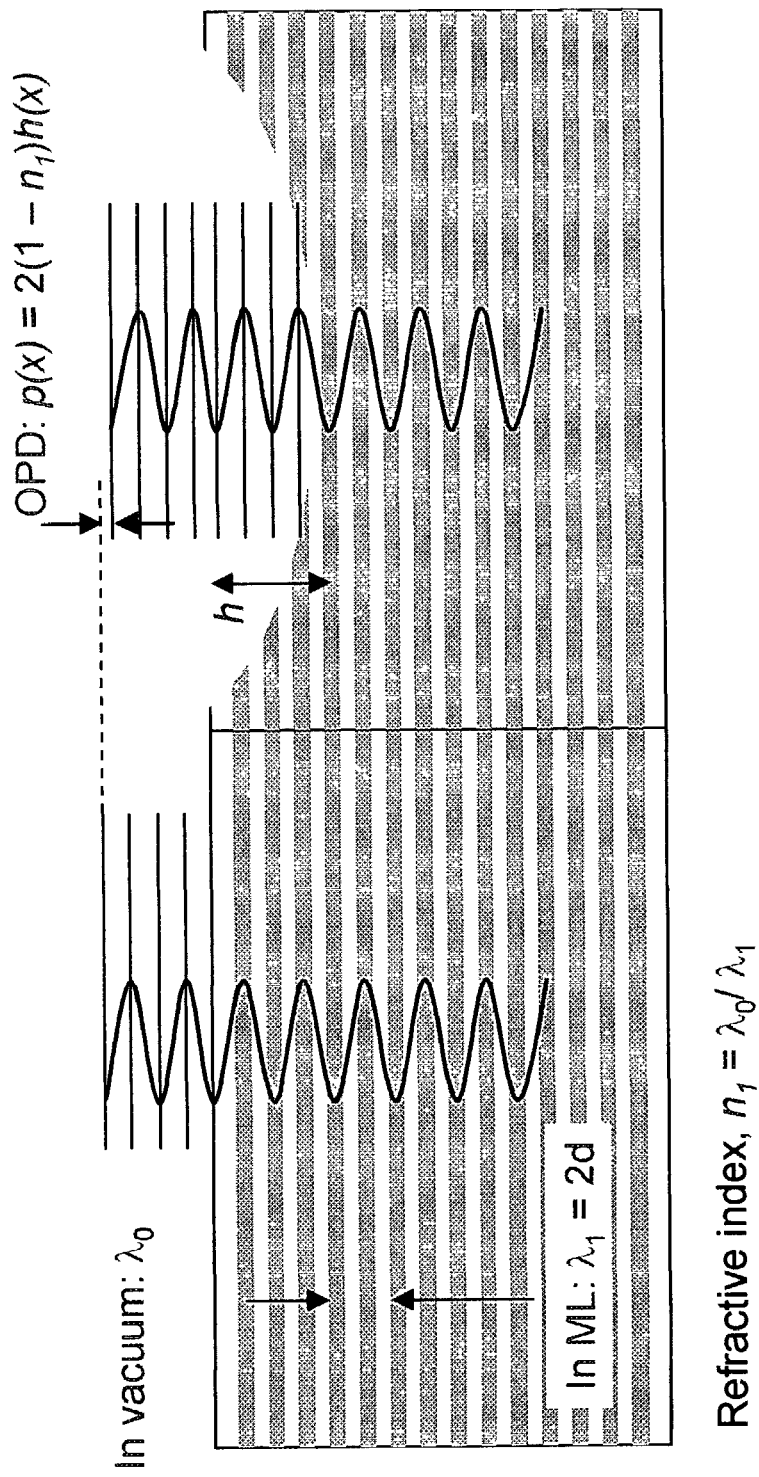
FIG. 2 illustrates EUV light reflecting from the multilayer.

FIG. 1 shows a plot of peak reflectivity, at normal incidence, of a MoSi multilayer as a function of the number of layers in the multilayer, for a wavelength of 13.4 nm. The multilayer period is 6.9 nm. FIG. 2 illustrates EUV light reflecting from the multilayer. Outside the multilayer, the difference in path length depends on the difference in refractive indices of the vacuum (n=1) and the multilayer ($n_1$=0.97 for Mo/Si at 13.4 nm wavelength).

The principle of this invention works for any multilayer design, regardless of period or constituent materials. When deposited on a substrate that has a low-spatial-frequency variation in height, the multilayer coating simply replicates that height profile in each of its layers. That is, the multilayer is conformal to the substrate. However, for substrate height variations that have lateral spatial periods smaller than about 1 micron, the multilayer tends to smooth out the variations. The multilayer removal process described here would be used primarily for correcting spatial periods of 0.1 mm or larger (depending on the polishing tool) where the multilayer is conformal to the substrate. In addition to correcting for substrate figure errors, the present method can also be used to correct for thickness errors in the multilayer itself (for example, if the rate of depositing the multilayer materials is not uniform across the optic).

The reflectivity is a resonant property of the coating whereby the fields reflected by every pair of layers interfere constructively. Thus the reflectivity occurs through the depth of the film. The incident and reflected beams interfere to cause a standing wave inside the multilayer. This interference is pinned by the multilayer structure, and the phase of the reflected beam is dependent on this multilayer structure. Consider what happens when a step of height h is milled into the top of the multilayer. The multilayer structure itself is unchanged below the region that is milled, and so this part of the multilayer is in phase with the multilayer in the un-milled region. The phase of the reflected beam is pinned by the same multilayer structure in both the milled and un-milled regions. The only difference is that the incident and reflected waves now travel through a height h of vacuum (of refractive index 1) in the milled region, or a height h of multilayer (of average refractive index n) in the un-milled region, before reaching the depth where the multilayer is identical. (EUV systems necessarily operate in vacuum to reduce absorption loss in air.) The difference in the optical path of the beam reflecting from the milled region to the beam reflecting from the un-milled region is then OPD=2(1−n)h, and the optical phase difference is $$\phi=4\pi(1-n)h/\lambda.$$

Consider a multilayer-coated aspheric substrate that differs from its desired surface height profile by an error $h_s(r)$, where r is the transverse vector coordinate. For spatial frequencies less than the multilayer-smoothing cutoff, the phase error of the reflected EUV wave will be given by $\phi_s(r)=4\pi h_s(r)/\lambda$, where $\lambda$ is the EUV wavelength. It is seen that this phase error can be completely corrected if the top of the multilayer is polished so that a depth $h_m(r)$ is removed, where $h_m(r)=h_s(r)/(1-n)$. Note that since n<1, a depression in the substrate is corrected by milling away multilayer coating above that depression. The technique is essentially to add a phase corrector to the surface of the mirror. The phase corrector consists of vacuum, which has a larger refractive index than the multilayer, and so retards the phase of light as compared to that which travels through the multilayer. Of course, the vacuum is not added to the multilayer, but the multilayer is removed. The novelty of our idea is that material is removed from the multilayer coating itself, and it is realized that this does not degrade the reflective properties of the multilayer.

The technique described here requires that an amount of multilayer can be removed without any damage to the bulk of the underlying multilayer. It has been experimentally demonstrated that this can indeed be achieved, using an electron beam. Other energetic particles should achieve similar results, and so ion-beam polishing, which is a method used for precisely figuring optical substrates, should be appropriate to our task. Some top-surface damage could be tolerated. For example, Molybdenum oxidizes to a greater extent than Silicon, so it is expected that where the top of the milled multilayer is Molybdenum, there will be a reflectivity drop of about 4%. However, this oxidation could be prevented by applying a passivation layer (such as Silicon) to the top surface of the multilayer as the last step in the polishing process. The polishing may cause some intermixing of the top and next to top layers of the multilayer. This will only cause a small drop in reflectivity, since the reflection is due to the cooperative effect of all layers in the multilayer stack. In addition the polishing process may roughen the top surface of the multilayer. This will have little effect on the performance of the multilayer, since it is only one out of many layers that is affected. (This is in contrast to roughness of the substrate, which does have a significant impact on the multilayer performance, because that roughness is imprinted into every layer of the multilayer.) Multilayer reflectivity depends on the number of bilayers in the stack, so removing layers will reduce the reflectivity. However, for 13.4 nm wavelength reflecting from MoSi multilayers, the reflectivity as a function of bilayers reaches its maximum at about 50 layers, and does not vary much for greater numbers of layers. Therefore, this effect will not be a problem if the minimum number of bilayers in a polished multilayer is kept larger than about 50. Given all these effects and ways to prevent them, it is to be expected that there will be some variation of reflectivity across the optic. This variation should be less than 1%, which should be tolerable in a microlithography system.

Multilayer films deposited on rigid substrates are usually in a state of stress. For example, MoSi multilayers exhibit compressive stress of about 400 MPa. This film stress causes the substrate to deform. This deformation is primarily spherical, which can be tolerated by the system. Film stress is linearly proportional to the film thickness. Therefore, polishing the film so that its thickness varies across an optic will cause film stress to vary across the optic. This will cause an increased amount of non-spherical deformation, of which the optical system is not tolerant. A study by Spence et al. "Film-stress-induced deformation of EUV reflective optics," Proc. SPIE 3679,724-734(1999) shows that the non-spherical deformation due to film stress variation of 10% is small, on the order of 0.1 nm RMS. The effect can be reduced further by reducing the multilayer stress (for example, by annealing) or increasing the substrate rigidity (for example, by increasing its thickness). Another way this effect can be overcome is to account for the stress-induced substrate deformation when polishing the multilayer.

The largest correction that can be made will be obviously limited by the thickness of the coating. However, as noted above, to reduce stress effects no more than about 10% of the total thickness should be removed. For a 70-layer-pair multilayer with bilayer period of 7 nm, this means that 50 nm of material can be removed. For a MoSi multilayer, this corresponds to a correction of a 1.5 nm error in the substrate. This is not a restriction to the technique, since errors larger than this would be measured and corrected in the substrate fabrication, prior to multilayer coating.

Polished multilayer coatings will induce a different phase on a reflected visible-light beam than for a EUV beam. This is because the visible light reflects from the top surface of the multilayer only, and hence sees the multilayer height variation without the refractive factor of 1−n. This is both an advantage and disadvantage. It is this difference that gives the present technique its great precision to make figure corrections. The multilayer figuring would be performed using feedback from visible-light interferometry, which measures directly the height profile of the top surface of the multilayer. State-of-the art visible-light interferometry has a precision better than 0.25 nm. This corresponds to a EUV correction precision of 0.0075 nm (7.5 pm). The disadvantage to the technique is that the assembled optical system will perform differently for EUV and visible light. EUV optical systems with unpolished multilayers perform almost identically for EUV and visible. This allows the alignment and characterization of the system to be performed using visible light, which is much easier and cheaper than using EUV light. It will still be possible to align a system with polished multilayers using visible light, but in this case the known multilayer figure correction must be taken into account.

One application for this technique is in the fabrication of optics for EUV lithographic projection systems. Currently, it is difficult to meet the exacting requirements of figure control over spatial periods from the size of the optic down to the micron level. For example, in small-tool polishing there is error in figuring spatial periods of about 1 mm, which corresponds to the size of the tool. This error can be removed by a tool with a larger footprint, or more traditional lapping, but this results in figure errors of much larger periods. With the present technique, the final figuring could be carried out after multilayer coating the optic. Since the sensitivity is much reduced, the errors remaining at the characteristic period of the tool will be correspondingly reduced.

Another application for this technique is in the optimization of system performance after alignment and characterization. The system consists of aspheric mirror substrates that are multilayer coated. Figure errors in the mirror substrates will cause a degraded system performance. From measurements of the system wavefront at many points throughout the imaging field, it is possible to determine figure error corrections to one or more of the mirrors that would improve the system wavefront (see Seya et al., U. S. Pat. No. 5,420,436, titled "Methods For Measuring Optical System, And Method And Apparatus For Exposure Using Said Measuring Method", incorporated herein by reference). The mirrors requiring correction would be removed from the system and the multilayers polished. Note that the measurement of the system wavefront can be made with much greater accuracy than the measurements of the individual mirror surfaces. This is because the system wavefront is spherical, whereas the individual mirrors are aspheric. Also, the errors from all the individual mirror measurements compound, so as mentioned above, the accuracy requirement of the individual mirror measurement is much tighter than the required performance of the system. The method described here allows the figure correction to be performed with unprecedented precision, and will allow the system wavefront to be corrected to a level only limited by the measurement of its spherical wavefront.

The foregoing description of the invention has been presented for purposes of illustration and description and is not intended to be exhaustive or to limit the invention to the precise form disclosed. Many modifications and variations are possible in light of the above teaching. The embodiments disclosed were meant only to explain the principles of the invention and its practical application to thereby enable others skilled in the art to best use the invention in various embodiments and with various modifications suited to the particular use contemplated. The scope of the invention is to be defined by the following claims.

We claim:

1. A method for correcting a figure of a multilayer coated substrate, comprising removing a first portion of a continuous multilayer coating segment from a multilayer coated substrate to a depth needed to mitigate a surface height error, wherein said surface height error was produced by an intrinsic defect in which a thickness error in said multilayer coating is caused by a nonuniformly deposited layer, wherein a second portion of said multilayer coating and a third portion of said multilayer coating are still attached to said substrate after said first portion has been removed, wherein said second portion was under said first portion prior to the removal of said first portion, wherein said second portion and said third portion together comprise at least one common continuous multilayer.

2. The method of claim 1, wherein said multilayer coating comprises a Mo/Si multilayer, wherein the removing of the first portion of the continuous multilayer coating segment from a multilayer coated substrate to a depth needed to mitigate the surface height error is performed by polishing and when deposited on the substrate that has a low-spatial-frequency variation in height, the multilayer coating simply replicates that height profile in each of its layers, which makes the multilayer conformal to the substrate.

3. The method of claim 1, wherein the step of removing material is carried out by directed energetic particles at said multilayer coating.

4. The method of claim 3, wherein said energetic particles are provided by an energy source selected from the group consisting of an ion beam and an electron beam.

5. The method of claim 1, wherein the step of removing a first portion of a multilayer coating includes depositing energy into said multilayer coating.

6. The method of claim 1, wherein the step of removing the first portion of the multilayer coating includes depositing thermal energy into said multilayer coating.

7. The method of claim 6, wherein the step of depositing thermal energy includes depositing laser energy.

8. The method of claim 6, wherein the step of depositing thermal energy includes bombarding said region with an electron beam.

9. The method of claim 6, wherein the step of depositing thermal energy includes bombarding said region with an ion beam.

10. The method of claim 1, wherein the step of removing the first portion of the multilayer coating comprises bombarding said region with atoms.

11. The method of claim 7, wherein the step of depositing laser energy is carried out with an excimer laser.

12. The method of claim 1, wherein removal of material in said region is localized to at least one area delineated by spatial extent.

13. The method of claim 12, wherein said at least one area comprises pixels.

14. The method of claim 1, wherein the step of removing the first portion of the multilayer coating is controlled as a function of time.

15. The method of claim 6, wherein the step of depositing thermal energy is controlled as a function of time wherein a desired height change is proportional to a duration of the step of depositing thermal energy.

16. The method of claim 6, wherein the step of removing the first portion of the multilayer coating is controlled as a function of an intensity of energy deposited into said region.

17. The method of claim 13, wherein said pixels comprise an abrupt spatial boundary.

18. The method of claim 17, wherein said abrupt spatial boundary comprises a geometric shape.

19. The method of claim 13, wherein said pixels comprise a non-abrupt spatial boundary.

20. A method for correcting a figure of a multilayer coated optic, comprising:
measuring the figure of multilayer coated optic, wherein said figure comprises a surface height error produced by an intrinsic defect in which a thickness error in the multilayer coating is caused by a nonuniformly deposited layer; and
removing a first portion of a continuous multilayer coating segment from a multilayer coated substrate to a depth needed to obtain a desired figure, wherein a second portion of said multilayer coating and a third portion of said multilayer coating are still attached to said substrate after said first portion has been removed, wherein said second portion was under said first portion prior to the removal of said first portion, wherein said second portion and said third portion together comprise at least one common continuous multilayer, wherein the removing of the first portion of the continuous multilayer coating segment from a multilayer coated substrate to a depth needed to mitigate surface height error is performed by polishing and when deposited on a substrate that has a low-spatial-frequency variation in height, the multilayer coating simply replicates that height profile in each of its layers, which makes the multilayer is conformal to the substrate.

21. A method for optimizing the performance of an EUVL system having multilayer coated reflective optics, comprising:
measuring, at a plurality of locations, the wavefront of a beam of light propagating within said EUVL system to determine figure error corrections to one or more of the mirrors that would improve the system wavefront;
removing an individual multilayer coated optic from said system, wherein said individual multilayer coated optic has a surface height error produced by an intrinsic defect in which a thickness error in the multilayer coating is caused by a nonuniformly deposited aver;
removing a first portion of a continuous multilayer coating segment from said individual multilayer coated optic to a depth needed to obtain a desired figure, wherein a second portion of said multilayer coating and a third portion of said multilayer coating are still attached to said substrate after said first portion has been removed, wherein said second portion was under said first portion prior to the removal of said first portion, wherein said second portion and said third portion together comprise at least one common continuous multilayer; and
placing said individual multilayer coated optic back into said system.

* * * * *

UNITED STATES PATENT AND TRADEMARK OFFICE
CERTIFICATE OF CORRECTION

PATENT NO. : 7,662,263 B2  Page 1 of 1
APPLICATION NO. : 10/256317
DATED : February 16, 2010
INVENTOR(S) : Chapman et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 968 days.

Signed and Sealed this

Thirtieth Day of November, 2010

David J. Kappos
*Director of the United States Patent and Trademark Office*